(12) United States Patent
Kanschat et al.

(10) Patent No.: US 8,319,573 B2
(45) Date of Patent: Nov. 27, 2012

(54) SIGNAL TRANSMISSION ARRANGEMENT

(75) Inventors: Peter Kanschat, Soest (DE); Uwe Wahl, Munich (DE); Marcus Nuebling, Esting (DE); Jens-Peer Stengl, Grafrath (DE)

(73) Assignee: Infineon Technologies Austria AG, Villach (AT)

( * ) Notice: Subject to any disclaimer, the term of this patent is extended or adjusted under 35 U.S.C. 154(b) by 257 days.

(21) Appl. No.: 12/646,731

(22) Filed: Dec. 23, 2009

(65) Prior Publication Data
US 2011/0148549 A1    Jun. 23, 2011

(51) Int. Cl.
  *H01P 5/12*    (2006.01)
  *H01F 30/06*   (2006.01)
(52) U.S. Cl. ..................... 333/24 R; 333/119
(58) Field of Classification Search ............... 333/24 R, 333/25, 26, 177, 246, 119; 336/200
See application file for complete search history.

(56) References Cited

U.S. PATENT DOCUMENTS

| | | | |
|---|---|---|---|
| 5,477,204 A * | 12/1995 | Li | 336/200 |
| 5,572,179 A * | 11/1996 | Ito et al. | 336/200 |
| 6,424,227 B1 * | 7/2002 | El-Sharawy | 330/307 |
| 6,927,662 B2 * | 8/2005 | Kahlmann et al. | 336/200 |
| 7,199,679 B2 * | 4/2007 | Mondal | 333/25 |
| 7,302,247 B2 * | 11/2007 | Dupuis | 455/280 |
| 7,376,212 B2 * | 5/2008 | Dupuis | 375/358 |
| 7,417,301 B2 | 8/2008 | Taghizadeh-Kaschani | |
| 7,489,526 B2 | 2/2009 | Chen et al. | |
| 7,495,525 B2 * | 2/2009 | Ilkov et al. | 333/26 |
| 2006/0120115 A1 | 6/2006 | Chen et al. | |
| 2007/0052514 A1 | 3/2007 | Chen et al. | |
| 2008/0094046 A1 | 4/2008 | Chen et al. | |

OTHER PUBLICATIONS

Nilsson, J. W., "Electric Circuits," Copyright 1983, Addison-Wesley Publishing Company, Inc., 4 pages.

Münzer, M., et al., "Coreless Transformer a New Technology for Half Bridge Driver IC's", The Fifth International Conference of Power Electronics and Drive System, 2003, pp. 93-96, vol. 1.

Gingerich, K., et al., "The ISO72x Family of High-Speed Digital Isolators", Texas Instrument, Application Report, Jan. 2006, pp. 1-11.

Chen, B., "iCoupler® Products with isoPower™ Technology: Signal and Power Transfer Across Isolation Barrier Using Microtransformers", Analog Devices Inc., 2006, pp. 1-4.

* cited by examiner

*Primary Examiner* — Dean O Takaoka
(74) *Attorney, Agent, or Firm* — Slater & Matsil, L.L.P.

(57) ABSTRACT

A signal transmission arrangement includes input terminals for receiving an input signal and output terminals for providing an output signal. A first transformer has a primary winding and a secondary winding, the primary winding being coupled to the input terminals. A second transformer has a primary winding and a secondary winding, the primary winding being coupled to the secondary winding of the first transformer, and the secondary winding being coupled to the output terminals.

27 Claims, 8 Drawing Sheets

SIGNAL TRANSMISSION ARRANGEMENT

TECHNICAL FIELD

The present disclosure relates to a signal transmission arrangement. The disclosure in particular relates to a signal transmission arrangement for signal transmission between different voltage domains.

BACKGROUND

A voltage domain is characterized by a reference voltage to which voltage signals occurring in the voltage domain are related. For signal transmission between two voltage domains having different reference potentials a signal transmission arrangement is required that allows signals to be transferred between the two domains but that prevents currents from flowing between the two voltage domains.

The two voltage domains may be implemented using integrated circuit devices. A signal transmission arrangement that is suitable for signal transmission between such voltage domains may be realized using integrated transformers that are also known as coreless transformers. A coreless transformer includes a primary and a secondary winding, these windings being arranged distant from one another and separated by a dielectric. The maximum voltage difference between the two voltage domains the transformer can withstand is dependent on the distance between the transformer windings and the isolation properties of the used isolation material (dielectric layer). The maximum difference voltage increases with increasing distance. However, thick dielectric layers, such as oxide layers, that are required for high voltage differences are difficult to produce with a sufficiently high accuracy and reliability using processes that are compatible with integrated circuits manufacturing processes.

SUMMARY OF THE INVENTION

A first aspect of the present disclosure relates to a signal transmission arrangement, including: input terminals for receiving an input signal, and output terminals for providing an output signal; a first coreless transformer having a primary winding, and a secondary winding, the primary winding being coupled to the input terminals; a second transformer having a primary winding, and a secondary winding, the primary winding being coupled to the secondary winding of the first coreless transformer, and the secondary winding being coupled to the output terminals.

A second aspect relates to a signal transmission arrangement, including: an input terminal for receiving an input signal, and an output terminal for providing an output signal; a first capacitor having a first capacitor plate, and a secondary capacitor plate, the first capacitor plate being coupled to the input terminals; at least a second capacitor having a first capacitor plate, and a second capacitor plate, the first capacitor plate being coupled to the second capacitor plate of the first capacitor, and the second capacitor plate being coupled to the output terminal.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The drawings should help to understand the basic principle, so that only features necessary for understanding the basic principle are illustrated. The elements of the drawings are not necessarily to scale relative to each other. Like reference numerals designate corresponding similar parts.

FIG. 5, which includes

FIG. 8, which includes

FIG. 9, which includes

DETAILED DESCRIPTION OF ILLUSTRATIVE EMBODIMENTS

Figure 1:
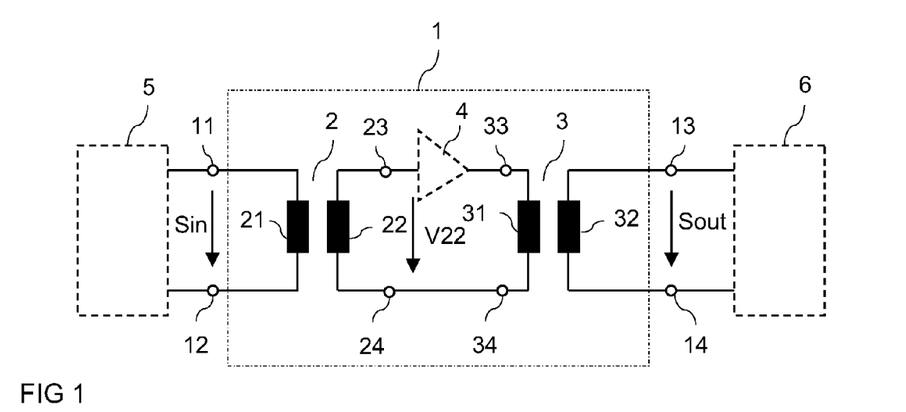
FIG. 1 illustrates a schematic diagram of a signal transmission arrangement including two transformers.

FIG. 1 schematically illustrates a signal transmission arrangement 1 for a signal transmission between two circuits, such as a transmitter circuit 5 and a receiver circuit 6. The arrangement includes input terminals 11, 12 for receiving an input signal Sin, and output terminals 13, 14 for providing an output signal Sout, with the output signal Sout being dependent on the input signal Sin. The arrangement further includes first and second transformers 2, 3 each having a primary winding 21, 31 and a secondary winding 22, 32, with the primary winding 21, 31 and the secondary winding 22, 32 of each of the transformers 2, 3 being inductively coupled with each other. Primary winding 21 of the first transformer 2 is coupled to the input terminals 11, 12, and secondary winding 32 of the second transformer 3 is coupled to the output terminal 13, 14. Primary winding 21 and secondary winding 22 of the first transformer 2 will also be referred to as first primary and secondary windings in the following, and primary winding 31 and secondary winding 32 of the second transformer 3 will also be referred to as second primary and secondary windings in the following.

In the example, according to FIG. 1 primary winding 21 of the first transformer 2 is electrically connected to the input terminals 11, 12, and the secondary winding 32 of the second transformer 3 is electrically connected to the output terminals 13, 14. However, this is only an example, there may be additional circuit elements or circuits, such as resistors or amplifiers, that are coupled between the input terminals 11, 12 and first primary winding 21, or between the second secondary winding 32 and output terminals 13, 14.

The first and second transformers 2, 3 are electrically coupled with each other in that secondary winding 22 of the first transformer 2 is coupled to the primary winding 31 of the second transformer 3. For this, a first terminal 23 of first secondary winding 22 is coupled to a first terminal 33 of second primary winding 31, and a second terminal 24 of first secondary winding 22 is coupled to a second terminal 34 of second primary winding 31. The first terminals 23, 33 and the second terminals 24, 34 may directly be connected with each other. Optionally an amplifier circuit 4 is connected between the secondary winding 22 of the first transformer 2 and the primary winding 31 of the second transformer 3. This optional amplifier circuit 4 amplifies output signals of the first transformer 2 into amplified output signals that are received by the second transformer 3. Output signals of the first transformer 2 are voltage signals present between the first and second terminals 23, 24 of the secondary winding 22, and input signals of the second transformer 3 are voltage signals present between the first and second terminals 33, 34 of the primary winding 31 of the second transformer 3.

The signal transmission arrangement illustrated in FIG. 1 is suitable for transmitting a voltage or current signal, such as input signal Sin, from a transmitter circuit, such as circuit 5 (shown in dashed lines) to a second circuit, such as receiver circuit 6 (shown in dashed lines). The signal transmission arrangement illustrated in FIG. 1 is, in particular, suitable for transmitting voltage signals between two circuits that have different voltage domains. Circuits that have different voltage domains are circuits that process voltage signals that are related to different reference voltages. Such circuits having different voltage domains are, for example, circuits that are galvanically decoupled and/or circuits that are "separated" by a potential barrier. Circuits that are galvanically decoupled are, for example, a control circuit generating a control circuit for a high-side switch and a driver circuit receiving the control signal and providing a drive signal for the high-side switch. Another example for two circuits that are galvanically decoupled is a secondary side circuit and a primary side circuit in a switching converter, such as a fly-back converter.

In the transmission arrangement according to FIG. 1, first transformer 2 receives the input signal Sin at its primary winding 21 and generates a first intermediate signal V22 from the input signal Sin at its secondary winding 22. The second transformer 3 receives the intermediate signal V22 at its primary winding 31 and generates the output signal Sout from the intermediate signal V22. Optionally intermediate signal V22 is amplified by optional amplifier circuit 4 that is connected between the two transformers 2, 3.

The signal transmission arrangement according to FIG. 1 may be realized in a number of different ways. A first example of realizing the signal transmission arrangement is illustrated in FIG. 2.

Figure 2:
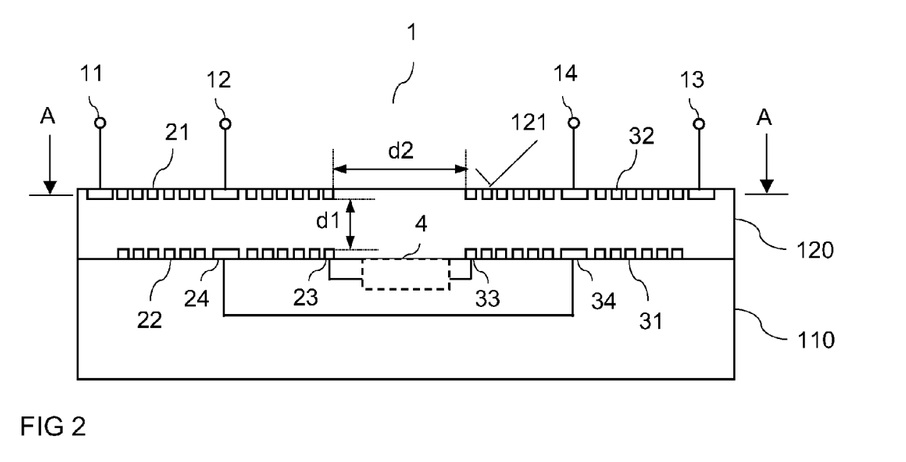
FIG. 2 illustrates a cross section through an arrangement according to a first example that includes a signal transmission arrangement including two transformers.

FIG. 2 schematically illustrates a cross section through an arrangement in which the signal transmission circuit 1 is integrated. The arrangement includes a substrate 110 and a dielectric layer 120 arranged on the substrate 110. Substrate 110 in particular is—but is not restricted to—a semiconductor substrate, such as a monocrystalline silicon (Si), silicon carbide (SiC), gallium arsenide (GaAs) substrate. According to a first example, substrate 110 merely serves as a carrier for the dielectric layer 120. According to another example integrated circuits, such as optional amplifier 4, and connection lines, such as connection lines between the two transformers, are integrated in this substrate 110.

The two transformers 2, 3 are arranged in the dielectric layer 120, with the first and second transformers 2, 3 being arranged distant to one another in a lateral direction of the dielectric layer 120, and with the primary windings 21, 31 and the secondary windings 22, 32 of each of the transformers being arranged distant to one another in a vertical direction of the dielectric layer 120. In the example according to FIG. 2 dielectric layer 120 is arranged on a surface of substrate 110. In this connection a vertical direction of the dielectric layer 120 is a direction that runs perpendicular to the surface of the substrate 110, and a lateral direction of the dielectric layer 120 is a direction that runs perpendicular to the vertical direction.

In the arrangement according to FIG. 2, the primary and secondary windings of transformers 2, 3 are planar windings, which means that the individual turns of each of these windings are arranged in the same plane. In the arrangement according to FIG. 2 primary winding 21 of the first transformer 2 and the secondary winding 32 of the second transformer 3 are arranged in the same plane that will be referred to as first plane in the following. Further, the secondary winding 22 of the first transformer 2 and the primary winding 31 of the second transformer 3 are arranged in the same plane that will be referred to as second plane in the following. The first plane is a plane close to a surface 121 of the dielectric layer 120, so that terminals of the first primary winding 21 and the second secondary winding 32 that form the input 11, 12 and output 13, 14 terminals are accessible via the surface 121. However, this is only an example. The windings that are arranged close to the surface of dielectric layer 120 in the example according to FIG. 2, and in the examples according to the following drawings, may also be buried in the dielectric layer 120 (distant to other windings in a vertical direction), and may be contacted through vias (not shown) that are filled with an electrically conducting material.

The first secondary winding 22 and the second primary winding 21 according to the present example are buried in the dielectric layer 120 close to the substrate 110. Electrical connections between terminals 23, 24 of the first secondary winding 22 and terminals 33, 34 of the second primary winding 31 are integrated in the substrate 110.

In FIG. 2 d1 is a distance in the vertical direction between the primary and the secondary windings of the two transformers 2, 3, and d2 is the distance between the two transformers, i.e., the distance between the first primary winding 21 and the second secondary winding 32, and the distance between the first secondary winding 22 and the second primary winding 31 in the lateral direction.

A voltage that may be applied between any of the input terminals and any of the output terminals of one of the two transformers 2, 3 is dependent on the first distance d1, with this maximum blocking voltage increasing with increasing first distance d1. The second distance d2 is equal to the first distance d1, or is larger than the first distance d1, i.e., d2>d1.

The second distance d2 is, for example, between d1 and 20·d1, in particular between 5·d1 and 10·d1.

In this case a maximum voltage that can be applied between any of the input terminals 11, 12 and any of the output terminals 13, 14 corresponds to two times the blocking voltage given by the first distance d1.

Thus, by providing two transformers 2, 3 that are connected in series with each other for a given layer thickness of dielectric layer 120 a maximum blocking voltage between the input and the output of the signal transmission arrangement can be obtained that is twice the maximum blocking voltage that can be obtained when using only one transformer. Thus, for a given layer thickness of the dielectric layer 120 a blocking voltage can be obtained that is twice the blocking voltage of known systems. Increasing the blocking voltage for a given layer thickness of dielectric layer 120 is in particular important when dielectric layer 120 is produced using common process steps for producing dielectric layers in integrated circuit technology. Such dielectric layers are, for example, deposited oxide layers. It is difficult to produce such layers with any desired layer thickness, with thin layers having a layer thickness of between about 1 μm and about 10 μm being easier to produce with a desired layer robustness and reliability.

Figure 3:
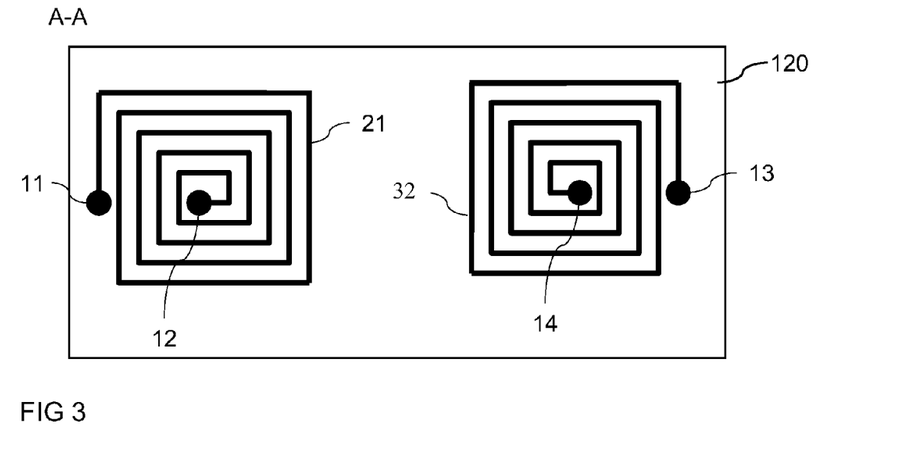
FIG. 3 illustrates a top view on the arrangement of FIG. 2.

FIG. 3 illustrates a cross section through the arrangement according to FIG. 2 in a horizontal section plane A-A that cuts through the first primary winding 21 and the second secondary winding 32. The following explanations concerning the first primary winding 21 and the second secondary winding 32 apply to the first secondary winding 22 and the second primary winding 31 accordingly. Referring to FIG. 3 the windings 21, 32 are, for example, spiral windings having a rectangular geometry. However, the spiral windings may have any other geometry, such as a circular geometry or an elliptical geometry.

Figure 4:
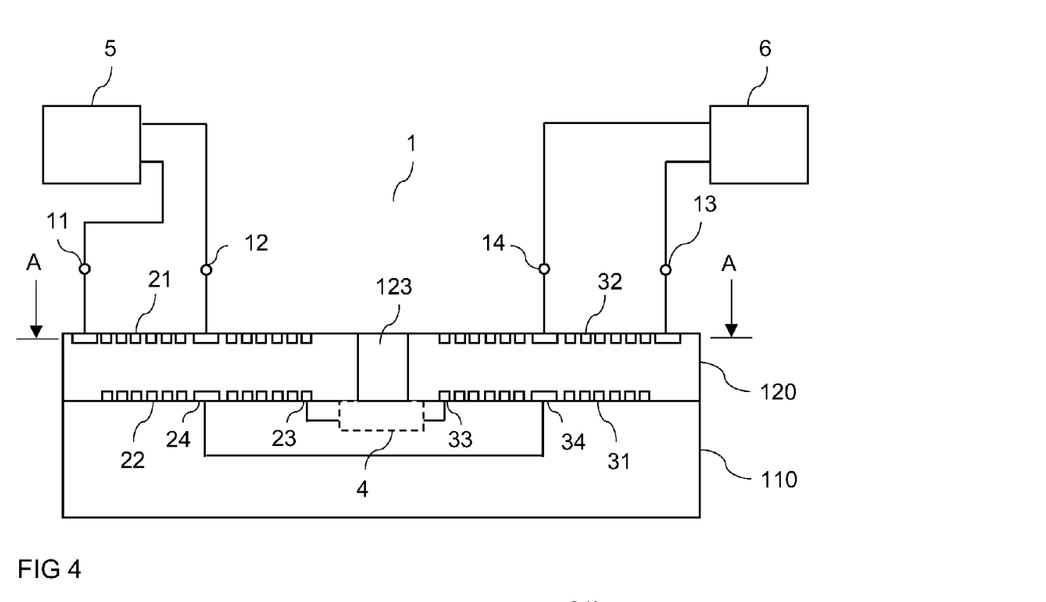
FIG. 4 illustrates an arrangement according to a second example in which a signal transmission arrangement having two transformers is arranged.

FIG. 4 illustrates an example that provides for a better insulation between the two transformers 2, 3. In this arrangement a trench 123 extends through the dielectric layer 120 down to the substrate 110. This trench is arranged between the two transformers 2, 3 in the dielectric layer 120, and is optionally filled with an insulation material. The filling material is, e.g., selected to have a higher voltage blocking capability than the material of the dielectric layer 120. In this case the mutual distance between the two transformers may even be reduced below the first distance (see d1 in FIG. 3), without reducing the maximum blocking voltage. The filling material is, e.g., a glass.

Schematically illustrated in FIG. 4 is a transmitter circuit 5 that is connected to the input terminals 11, 12, and a receiver circuit 6 that is connected to the output terminals 13, 14. These two circuits 5, 6 that are galvanically decoupled from each other by the signal transmission arrangement 1 may be realized in any known circuit technology, in particular in an integrated circuit technology.

The windings of the first and second transformers 2, 3 are made of an electrically conductive material, such as a metal or a highly doped polycrystalline semiconductor material, such as polysilicon. These windings may be produced using any known technology for producing planar windings in a dielectric layer. A first example of a method for producing the two windings of the transformers 2, 3 will now be illustrated with reference to FIGS. 5A through 5D. In the method illustrated two transformers 2, 3 are produced using identical process steps. However, the method is also suitable for producing only one transformer on a substrate.

Figure 5A:
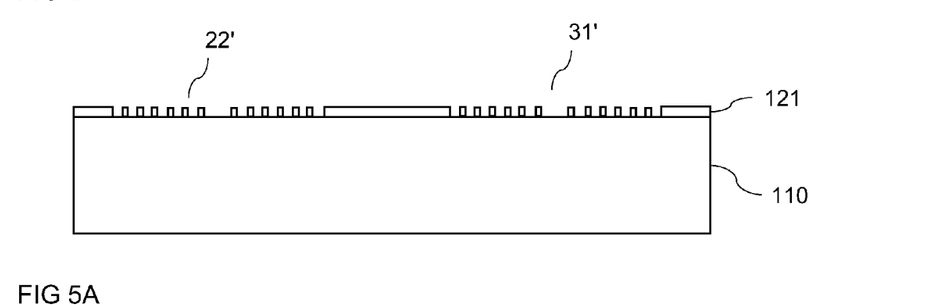
FIGS. 5A-5D, illustrates a method for forming transformers in a dielectric layer on a substrate.

Referring to FIG. 5A a first dielectric layer 121 is deposited on the substrate 110, and trenches 22', 31' are etched into the first dielectric layer 121. Trenches 22', 31' have the geometry of the windings of the transformers 2, 3.

Figure 5B:
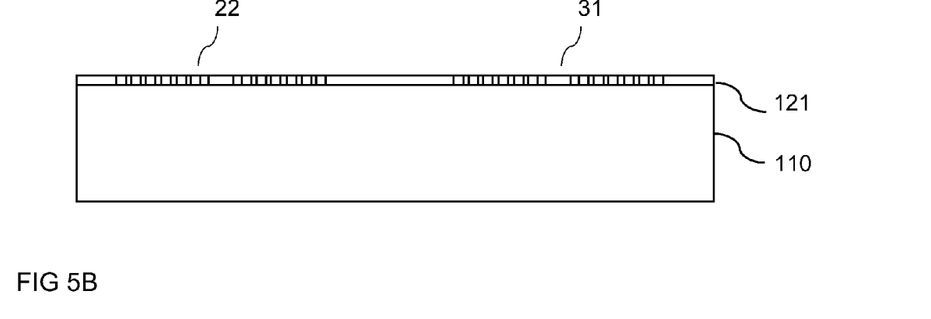

Referring to FIG. 5B trenches 22', 31' are filled with an electrically conducting material, such as a metal or a highly doped polycrystalline material, such as polysilicon. The electrically conducting material in the trenches 22', 31' forms of one of the windings of the transformers, such as the secondary winding 22 of the first transformer 2, and the primary winding 31 of the second transformer 3.

Figure 5C:
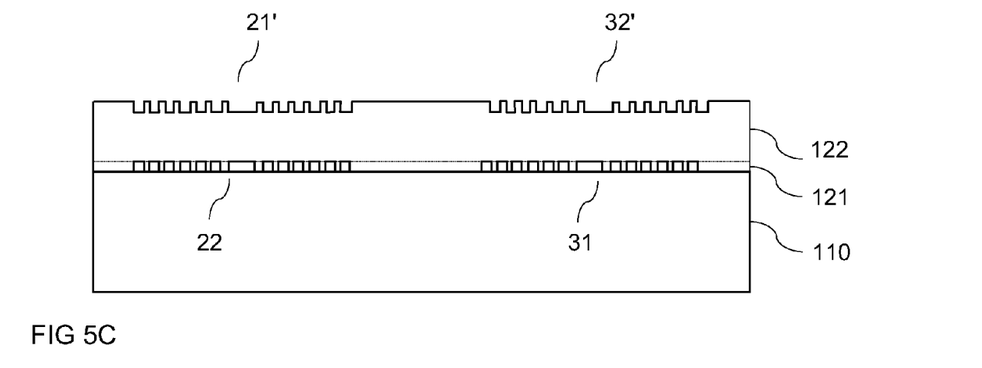

Referring to FIG. 5C, a second dielectric layer 122 is deposited on the first layer 121 that includes windings 22, 31, and further trenches 21', 32' are etched into the second dielectric layer 122. These further trenches have the geometry of further windings of the two transformers, such as primary winding 21 of the first transformer 2, and secondary winding 32 of the second transformer 3.

Figure 5D:
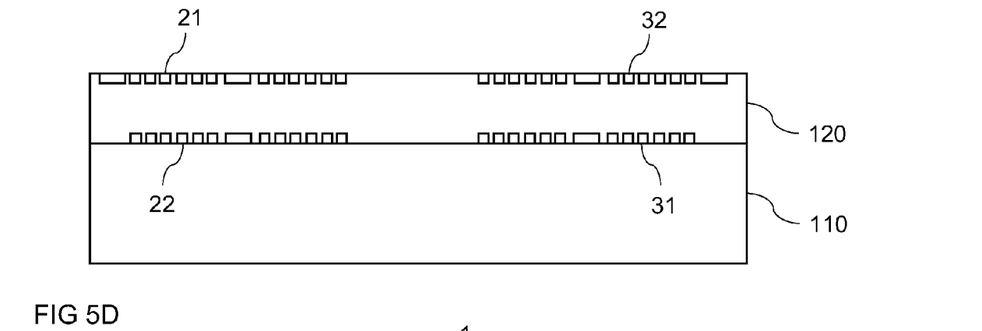

Referring to FIG. 5D, these further trenches 21', 32' are filled with an electrically conducting material, with the filling material forming the further windings 21, 32.

Dependent on the distance d1 between the primary and secondary windings of one transformer more than two dielectric layers 121, 122 may be deposited in order to form dielectric layer 120.

Figure 6:
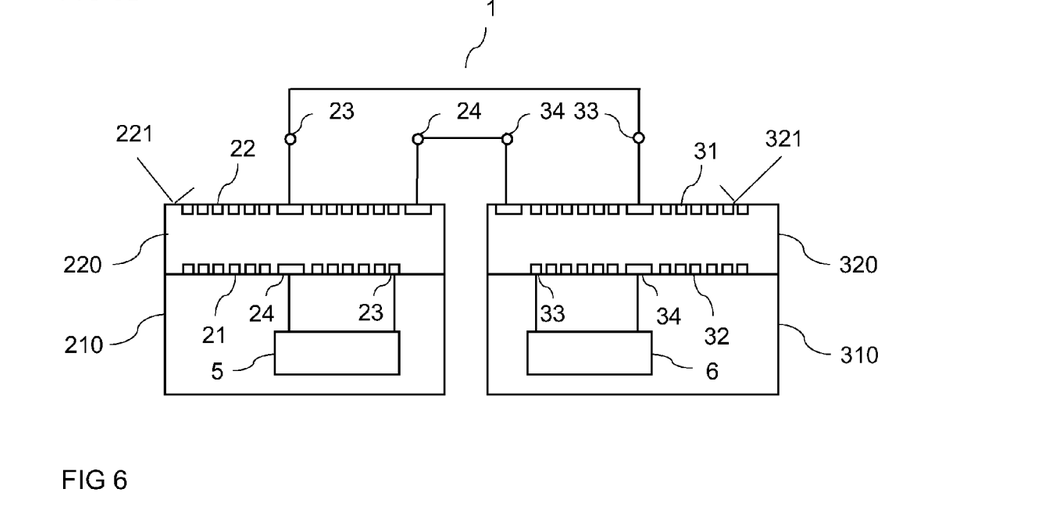
FIG. 6 illustrates a cross section through an arrangement according to a third example in which a signal transmission arrangement having two transformers is arranged.

In the examples according to FIGS. 2 and 4 the two transformers 2, 3 are realized in a common dielectric layer 120 that is arranged on a common substrate 110. FIG. 6 illustrates a cross section through an arrangement in which the first and second transformers 2, 3 are realized in separate dielectric layers 220, 320. The first transformer with the first primary winding 21 and the first secondary winding 22 is arranged in a first dielectric layer 220 that is arranged on a first substrate 210 such as a semiconductor substrate. The second transformer with the second primary winding 32 and the second secondary winding 32 is arranged in a second dielectric layer 320 that is arranged on a second substrate 310, such as a semiconductor substrate. In the example according to FIG. 5 the transmitter circuit 5 (that is only schematically shown) is integrated in the first semiconductor substrate 210 and is electrically connected to the primary winding 21 of the first transformer. In this example the first primary winding 21 is buried in the dielectric layer close to the first substrate 210, while the first secondary winding 22 is arranged near a surface 221 of the first dielectric layer 220.

In a first embodiment the surfaces of the two substrates 210, 310 that face away from the dielectric layers 220, 320 are mounted on a common carrier (not shown). For electrically connecting the secondary winding 22 of the first transformer and the primary winding 31 of the second transformer connection lines, such as bonding wires, may be used.

In a second embodiment the two semiconductor arrangements with the substrates 210, 310 and the dielectric layers 220, 320 are mounted on a wiring board, such as a printed circuit board (PCB), such that the dielectric layers 220, 320 face the board. The printed circuit board has contact terminals and connection lines between the contact terminals, the two arrangements being mounted on the board such that the secondary winding 22 of the first transformer and the primary winding 31 of the second transformer are interconnected through the connection lines of the board.

The receiver circuit 6 (that is only schematically shown) is integrated in the second semiconductor substrate 310 and is connected to the secondary winding 32 of the second transformer. In this example the secondary winding 32 of the second transformer is buried in the second dielectric layer 320 close to the second substrate 310. The primary winding 31 of the second transformer is arranged near a surface 321 of the second dielectric layer 320. The first secondary winding 22 and the second primary winding 31 are electrically connected with each other by connection lines that contact terminals 23, 24 and 33, 34 of these windings 22, 31.

Figure 7:
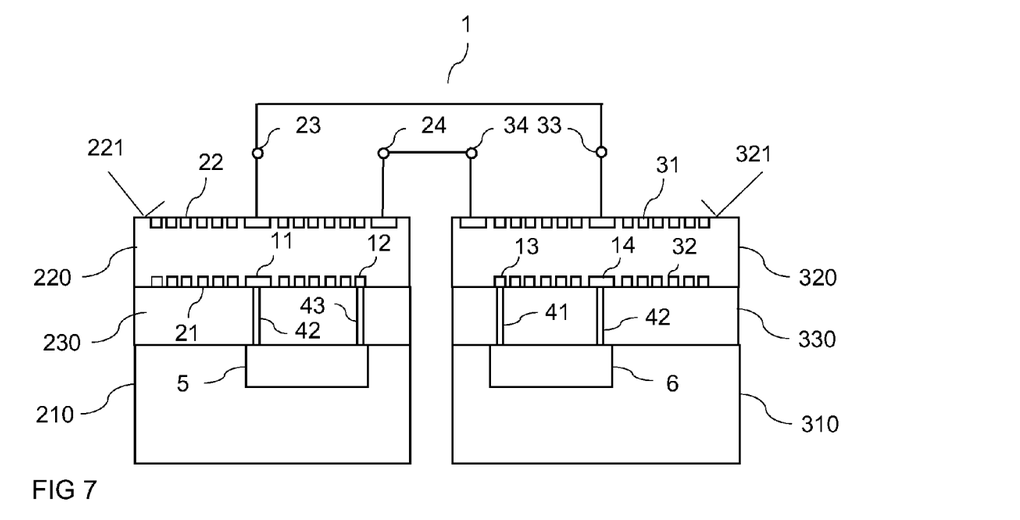
FIG. 7 illustrates a cross section through an arrangement according to a fifth example in which a signal transmission arrangement having two transformers is arranged.

FIG. 7 illustrates an embodiment in which two transformers are arranged in two different dielectric layers: A first dielectric layer 220 that is arranged on a first electrically insulating carrier layer 230; and a second dielectric layer 320 that is arranged on a second electrically insulating carrier layer 330. The first carrier layer 230 is arranged on a first semiconductor substrate 210. The first transmitter circuit 5 is integrated in the first semiconductor substrate 210 and is electrically connected through vias 42, 43 that extend through the first carrier layer 230 with the primary winding 21 of the first transformer. The vias 42, 43 are filled with an electrically conducting material, such as a metal. The first primary winding 21 is buried in the first dielectric layer 220 and is arranged close to or in contact with the first carrier layer 230. The first secondary winding 22 is arranged near a surface 221 of the first dielectric layer 220 and has its terminals 23, 24 electrically connected with terminals 33, 34 of the second primary winding 31. The second primary winding 31 is arranged in the second dielectric layer 320 near a surface 321 of this dielectric layer 320. The second secondary winding 32 is buried in the second dielectric layer 320 close to or in contact with the second carrier layer 330. The second secondary winding 32 is connected through vias 41, 42 that extend through the second carrier layer 330 with the receiver circuit 6 integrated in the second semiconductor substrate 310.

In the arrangement according to FIG. 7 the sub-arrangements including the dielectric layers and the carrier layers can be processed separately from the semiconductor substrate. Having processed the semiconductor substrates, i.e., having integrated the transmitter and/or receiver circuits in the semiconductor substrates, the sub-arrangements including the carrier layers and the dielectric layers and with the vias extending through the carrier layers are arranged on the semiconductor substrates.

Figure 8A:
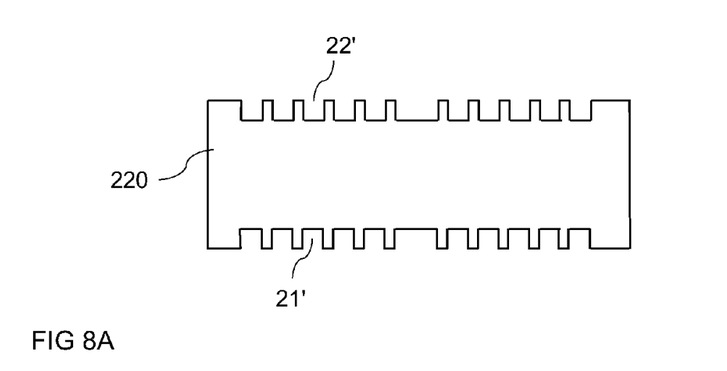
FIGS. 8A-8B, illustrates a first embodiment of a method for forming a separate transformer arrangement.
Figure 8B:
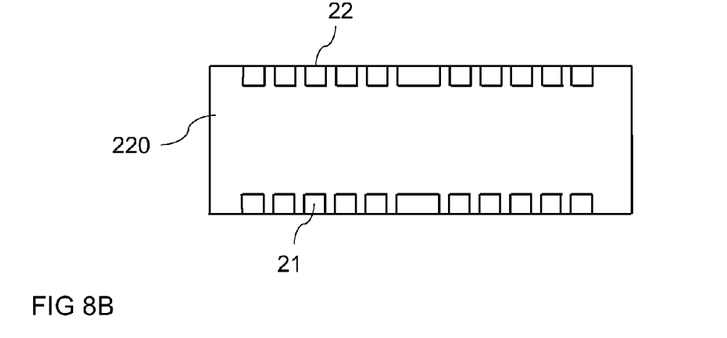

The transformer arrangements, i.e., the arrangements including the dielectric layers 220, 320 and the transformer windings 21, 22, 31, 32 arranged in or on the dielectric layers 220, 320 may be processed separately from the semiconductor substrate. FIGS. 8A-8B illustrate a first embodiment of a method for forming a separate transformer arrangement. In FIGS. 8A-8B a method for forming the first transformer 2 integrated in dielectric layer 220 is illustrated. However, this method may be used in an identical manner for forming the second transformer 3.

Referring to FIG. 8A a dielectric substrate 220 is provided. In this substrate 220 trenches 21', 22' are formed on opposites sides, the trenches having the desired form of the primary winding 21 and the secondary winding 22 of the first transformer to be integrated in the dielectric substrate 220. Referring to FIG. 8B the trenches are filled with an electrically conducting material, such as a metal, thereby forming the transformer windings 21, 22.

The arrangement obtained through this method may then be mounted on a semiconductor substrate, where an additional carrier layer may be arranged between the semiconductor substrate and the dielectric substrate 220 including the transformer.

According to another example (not illustrated) an arrangement including a carrier layer, such as carrier layers 230, 330 and a transformer is formed using the method steps that have been illustrated with reference to FIGS. 5A-5D, with the difference that the dielectric layers 121, 122 are deposited on the carrier layer instead of a semiconductor substrate.

Figure 9A:
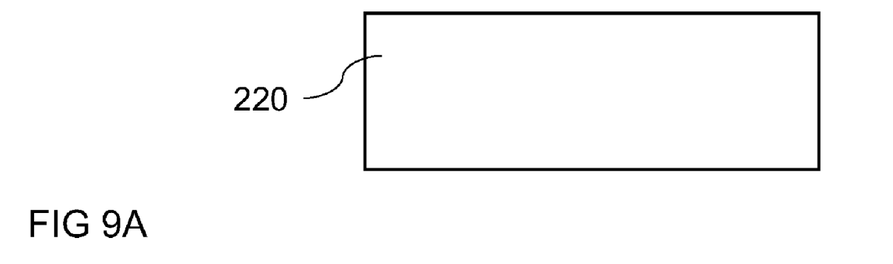
FIGS. 9A-9C, illustrates a second embodiment of a method for forming a separate transformer arrangement.
Figure 9B:
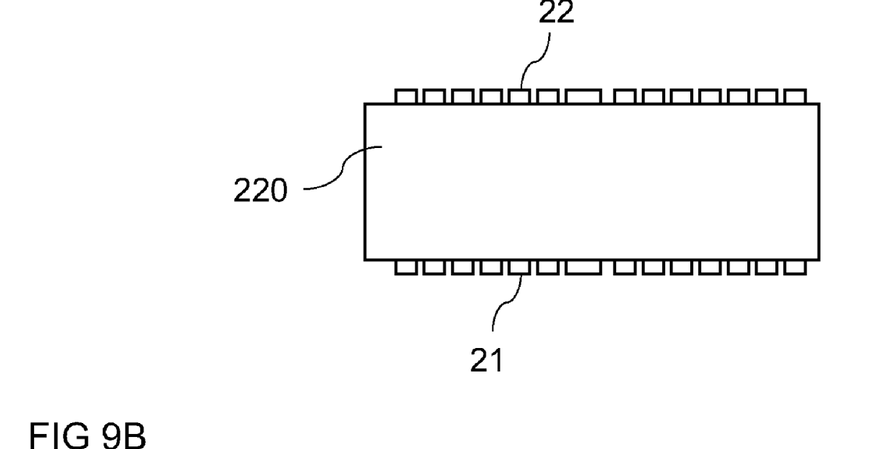
Figure 9C:
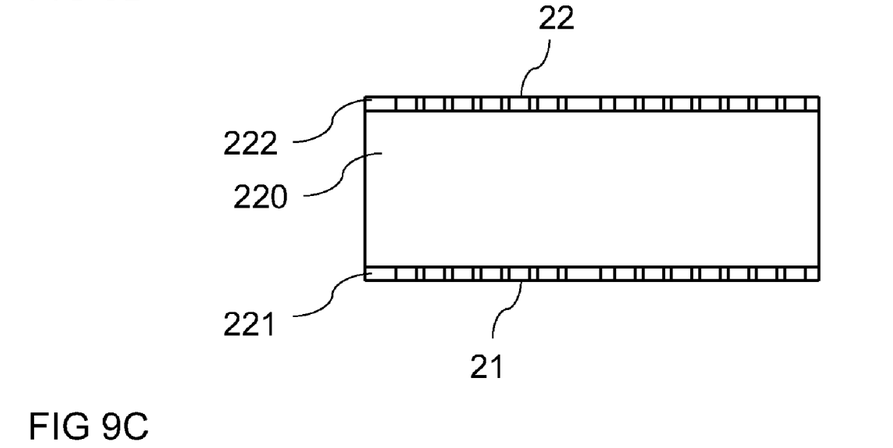

FIGS. 9A-9C illustrate a second embodiment of a method for forming a separate transformer arrangement. In FIGS. 9A-9C a method for forming the first transformer 2 integrated in dielectric layer 220 is illustrated. However, this method may be used in an identical manner for forming the second transformer 3.

Referring to FIG. 9A a dielectric substrate 220 is provided. On opposite sides of this substrate transformer windings 21, 22 are laminated (FIG. 9B). These windings may be formed by depositing electrically conducting layers on opposite sides of the substrate 220, followed by method steps of structuring these layers in order to obtain windings 21, 22. According to another example these windings are produced separately from the dielectric substrate 220 and are then attached to the substrate 220 by, for example, gluing.

Referring to FIG. 9C the surfaces of the substrate 220 may be planarized by filling gaps between the windings 21, 22 with a dielectric filler layers 221, 222.

Figure 10:
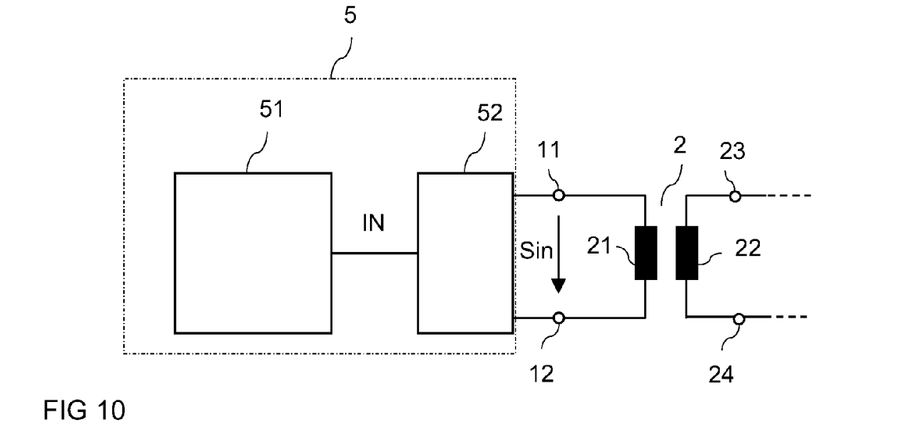
FIG. 10 illustrates a first example of a transmitter arrangement connected to input terminals of the signal transmission arrangement.

FIG. 10 shows a block diagram of a transmitter circuit 5 that is suitable for providing an input signal Sin to be transmitted via the signal transmission arrangement. The transmitter circuit 5 according to FIG. 10 includes a signal generation circuit 51 that generates a transmission signal IN. Transmission signal IN may assume two different signal levels that will be referred to as on-level and off-level in the following. An excitation circuit 52 receives the transmission signal IN and generates the input signal Sin dependent on the transmission signal IN. Excitation circuit 52 is adapted to generate an oscillating input signal Sin dependent on the transmission signal IN. For explanation purposes it may be assumed that excitation circuit 52 generates an oscillating signal Sin if the transmission signal IN has an on-level, and generates an input signal Sin having zero amplitude if transmission signal IN assumes its off-level. Excitation circuit 52 forms an oscillation circuit with the transformers 2, 3 of the signal transmission arrangement. Thus, if the input signal Sin is an oscillating signal, the output signal (see Sout in FIG. 1) of the signal transmission arrangement 1 is also an oscillating signal. If the input signal Sin has zero amplitude, then the output signal Sout also has zero amplitude. Delay times between changes in the input signal Sin and corresponding changes in the oscillating signal are negligible, i.e., are in the range of several nanoseconds, if the oscillator circuit has a high quality. By simply evaluating if the output signal Sout has a zero amplitude or if the output signal Sout is an oscillating signal, the signal level of the transmission signal Sin can be determined or, in other words: A reception signal that corresponds to the transmission signal IN can be generated from the output signal Sout.

Figure 11:
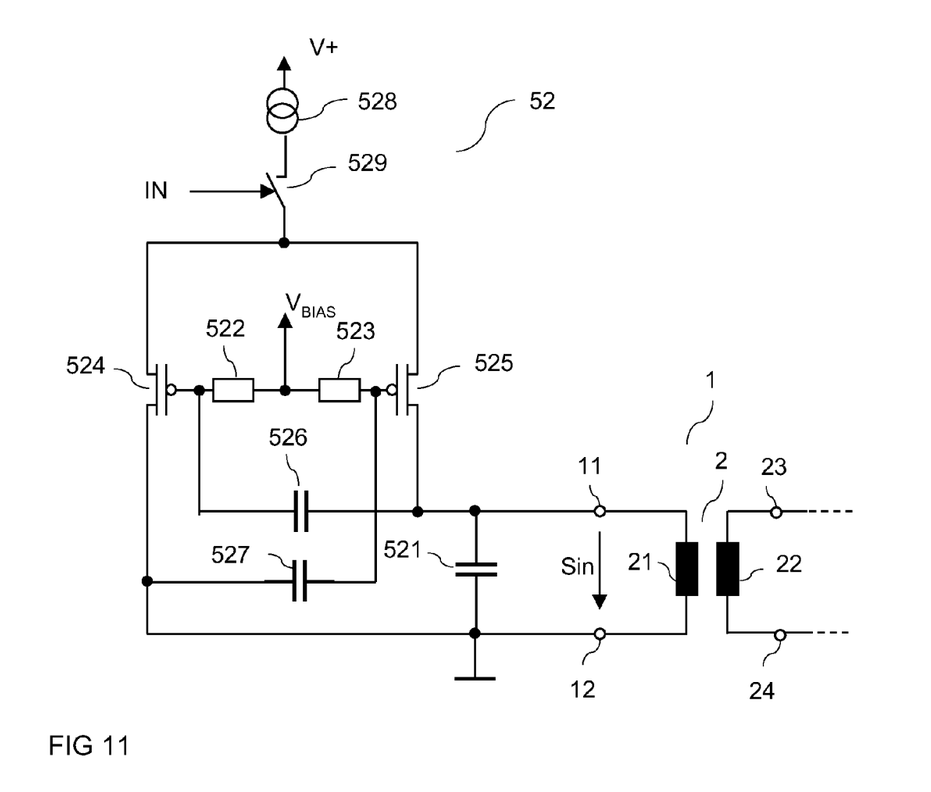
FIG. 11 illustrates a circuit diagram of an oscillator circuit of the transmitter circuit according to FIG. 8.

Excitation circuit 52 may be any circuit that, together with the transformers of the signal transmission arrangement 1, forms an oscillating circuit. An example of excitation circuit 52 is illustrated in FIG. 11. The excitation circuit according to FIG. 11 includes a first capacitance 521 connected in parallel with the input terminals 11, 12. First capacitance 521 and the transformers of the signal transmission arrangement form a parallel resonance circuit. This resonance circuit is excited by an excitation stage. Excitation stage includes two transistors 524, 525 that have their gate terminals coupled to a terminal for a bias voltage $V_{BIAS}$ via resistors 522, 523. A first one 524 of these transistors has its gate terminal coupled to a first terminal of the first capacitance 521 via a second capacitance 526, and a second one 525 of these transistors has its gate terminal coupled to a second terminal of the first capacitance 521 via a third capacitance 527. The first transistor 524 has its load path connect between the second terminal of the first capacitance 521 and a current source 528, while the second transistor 525 has its load path connected between the first terminal of the first capacitance 521 and the current source 528. Current source 528 can be switched on and off by transmission signal IN. For this purpose in the example according to FIG. 9 a switch 529 is provided that receives the transmission signal IN and that is connected in series with the current source 528. However, any other means for switching on and off the current source 528 may be applied as well. The excitation stage is activated if transmission signal IN assumes its on-level, i.e., if switch 529 is closed. In this case the excitation stage supplies a current with alternating current flow direction to the parallel resonant circuit, thereby generating the oscillating input signal Sin.

The resonance frequency of the oscillator circuit is only dependent on the characteristics of the LC circuit formed by the transformer arrangement 1 with the at least two transformers 2, 3 and capacitance 521 connected parallel with the input terminals 11, 12. Time constants of RC element formed by resistors 522, 523 and capacitances 526, 527 should be higher than the RC constant of the LC circuit. Apart from that these RC elements do not influence the resonant frequency of the oscillator circuit.

It goes without saying that the excitation stage illustrated in FIG. 11 is only an example. Of course, any other excitation stage may be used as well.

Figure 12:
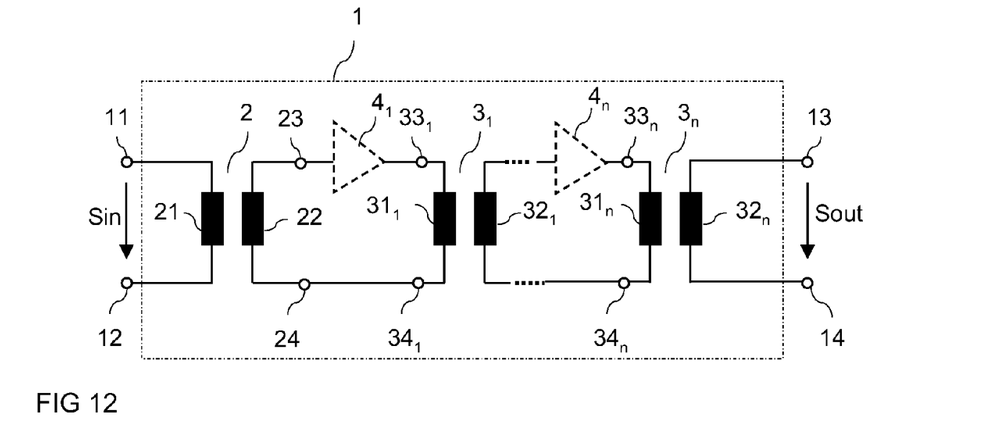
FIG. 12 illustrates a schematic diagram of a signal transmission arrangement having more than two transformers.

FIG. 12 schematically illustrates a signal transmission arrangement 1 according to a further example. According to this example more than two transformers are connected in series between the input terminals 11, 12 and the output terminals 13, 14. In the example according to FIG. 12 three transformers are illustrated: a first transformer 2 having a primary winding 21 coupled to the input terminals 11, 12 and a secondary winding 22; a second transformer $3_1$ having a primary winding $31_1$ with input terminals $33_1$, $34_1$ coupled to the secondary winding 22 of the first transformer, and a secondary winding $32_k$; and a third transformer $3_n$ with a primary winding $31_n$ having input terminals $33_n$, $34_n$ coupled to the secondary winding $32_1$ of the second transformer $3_1$, and a secondary winding $32_n$. The secondary winding $32_n$ of the circuit transformer $3_n$ is coupled to the output terminals 13, 14. As illustrated by dotted lines in FIG. 12 additional transformers may be connected between the second transformer $3_1$ and the third transformer $3_n$. Optionally amplifier circuits $4_1$, $4_n$ are connected between two neighboring transformers in the cascaded transformer structure according to FIG. 12.

The signal transmission arrangement 1 explained hereinabove includes at least two transformers that are connected in cascade and that serve to galvanically isolate two signal processing circuits, such as a transmitter circuit 5 and a receiver circuit 6 from one another. By using at least two transformers a higher voltage blocking capability can be obtained than by using only one transformer, when a maximum thickness of a dielectric layer that is employed for implementing the transformers is given.

Figure 13:
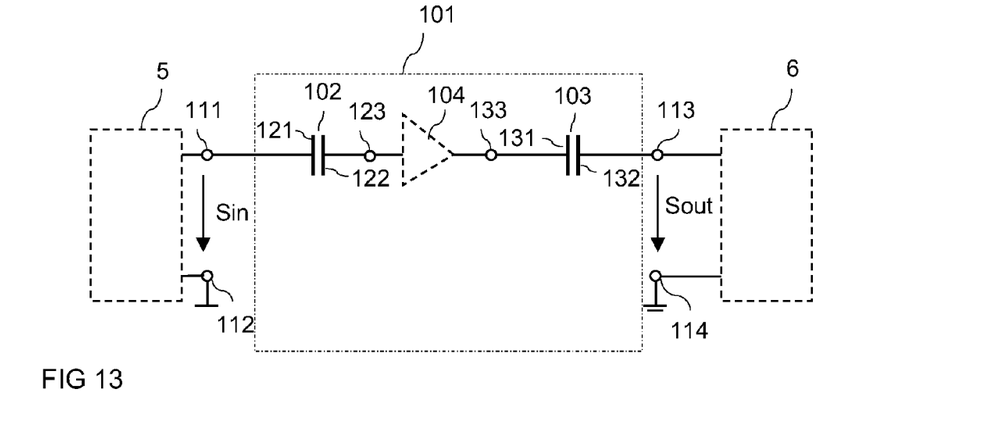
FIG. 13 illustrates a schematic diagram of a signal transmission arrangement including two capacitors.

FIG. 13 schematically illustrates a further embodiment of a signal transmission arrangement 101. The signal transmission circuit of FIG. 13 has an input 111 for connecting a first signal processing circuit 5, such as a transmitter, thereto, and has an output 113 for connecting a second signal processing circuit 6, such as a receiver, thereto. The signal transmission circuit 101 of FIG. 13 is different from the signal transmission circuit 1 according to FIGS. 1 to 12 in that the signal transmission circuit 101 employs at least two capacitors 102, 103 for galvanically decoupling the first and second signal transmission circuits 5, 6. The two capacitors 102, 103 are connected in series with each other between the input and the output terminals 111, 113. Each of the two capacitors has a first and a second capacitor plate, a first capacitor plate 121 of the first capacitor 102 being coupled to the input terminal 111, and a second capacitor plate 132 of the second capacitor 103 being coupled to the output terminal 113. The second capacitor plate 122 of the first capacitor 102 and the first capacitor plate 131 of the second capacitor 103 are electrically coupled with each other.

Optionally, an amplifier 104 is connected between the second capacitor plate 122 of the first capacitor 102 and the first capacitor plate 131 of the second capacitor 103. According to one embodiment the second capacitor plate 122 of the first capacitor 102 and the first capacitor plate 131 of the second capacitor 103 are electrically connected with each other by an electrically conducting line.

In the signal transmission arrangement 101 of FIG. 13 the input terminal 111 and the output terminal 113 are capacitively coupled with each other. A change in the potential at the input terminal 111 results in an equivalent change of the potential at the output terminal 113. Hence, a preferably fast voltage change dV/dt at the input terminal 111 will result in a capacitive current which is proportional to dV/dt at the output terminal 113 which, for instance may be detected as a voltage drop across a resistor connected to the ground potential 114 of the receiving circuit 6.

The signal transmission arrangement 101 is as well suitable for transmitting an oscillating input signal Sin, where this input signal Sin is applied between the input terminal 111 and a first terminal 112 for a reference potential. An oscillating input signal Sin applied to the input terminal 111 results in an oscillating output signal Sout, where the output signal Sout is present between the output terminal 113 and a terminal 114 for a second reference potential. First and second reference potentials can be different from one another.

The capacitor plates 121, 122 of the first capacitor 102 and the capacitor plates 131, 132 of the second capacitor 103 are each dielectrically insulated from one another by a dielectric layer, which will be referred to as capacitor dielectric in the following. A maximum voltage the signal transmission arrangement 101 can withstand between the input and the output terminals 111, 113 or the signal transmission arrangement 101 can withstand between the first and second reference potentials, respectively, is given by the maximum voltage the series circuit with the two capacitors 102, 103 can withstand. By connecting two capacitors 102, 103 in series a higher maximum voltage can be obtained compared to using only one capacitor.

It goes without saying that more than two capacitors can be connected in series between the input and the output terminals 111, 113 in order to further increase the maximum voltage.

A possible transfer protocol for transferring a two-valued signal from the transmitter circuit 5 to the receiver circuit 6 is as follows:

For transmitting a first value the transmitter circuit 5 applies an oscillating signal to the input terminal 111. The oscillating signal at the input terminal 111 results in an oscillating signal at the output terminal 113. Receiver circuit 6 detects the oscillating output signal, and decides that a first value of the signal to be transmitted was transmitted.

For transmitting a second value of the signal to be transmitted transmitter circuit 5 applies a constant signal at the input terminal 111, for example, by short-circuiting the input terminal 111 with the terminal 112 for the first reference potential. The constant signal at the input terminal 111 results in a constant signal of the output terminal 113, with this constant signal being detected by the receiver circuit 6 to represent a second value of the signal to be transmitted.

Figure 14:
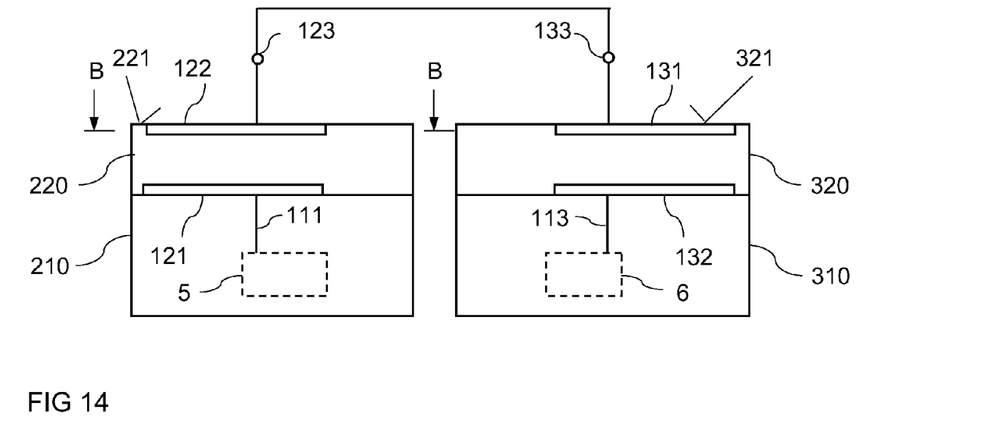
FIG. 14 illustrates a cross section through an arrangement according to a first example in which a signal transmission arrangement having two capacitors is arranged.

A first example for implementing a signal transmission arrangement 101 according to FIG. 13 will now be explained with reference to FIG. 14. FIG. 14 illustrates a cross section through two semiconductor arrangements in which capacitor plates 121, 122 of the first capacitor 102 and 131, 132 of the second capacitor 103 are integrated. Referring to FIG. 14, the first and second capacitor plates 121, 122 of the first capacitor 102 are arranged in a first dielectric layer 220 that is arranged on a first semiconductor substrate 210. Optionally, the transmitter circuit 5 is integrated in the first semiconductor substrate 210. The capacitor plates 131, 132 of the second capacitor 103 are arranged in a second dielectric layer 320 which is arranged on a second semiconductor substrate 310. Optionally, the receiver circuit 6 is integrated in the second semiconductor substrate 310. The second capacitor plate 122 of the first capacitor 102 and the first capacitor plate 131 of the second capacitor 103 are electrically connected with each other (an optional amplifier is not illustrated in FIG. 14). For electrically connecting the two capacitor plates 122, 131 of the two semiconductor arrangements usual electrically conducting wires, such as bonding wires, may be used.

FIG. 14 illustrates cross sections through the two semiconductor arrangements in a vertical direction. In the horizontal plane the capacitor plates 121, 122, 131, 132 may have any suitable geometry.

Figure 15:
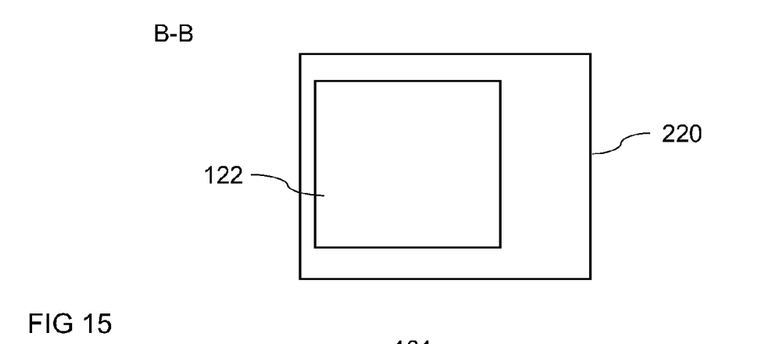
FIG. 15 illustrates a cross section through a capacitor plate of one capacitor.

FIG. 15 illustrates a cross section through the second capacitor plate 122 of the first capacitor 102 in a horizontal section plane B-B. In the example illustrated second capacitor plate 122 has a rectangular, in particular square, geometry. However, any geometry other than a rectangular geometry, such as, e.g., an elliptical or circular geometry, or even a spiral-shaped geometry, may be used as well. According to an embodiment the two capacitor plates that form one of the capacitors 102, 103 have the same geometry.

The embodiment of the capacitive signal transmission arrangement 101 according to FIG. 14 is based on the embodiment of the inductive signal transmission arrangement 1 according to FIG. 6. The individual parts of the semiconductor arrangements according to FIG. 14 are, therefore, denoted with the same reference characters as the corresponding parts of the semiconductor arrangements according to FIG. 6.

In general the capacitor signal transmission arrangement 101 can be implemented in the same way as the inductive signal transmission arrangement 1 with the difference, that instead of the primary and secondary windings 21, 22, 31, 32 of the inductive signal transmission arrangements 1 first and second capacitor plates 121, 122, 131, 132 are used, and with the difference that the capacitive signal transmission arrangement 101 has only one input terminal 111, and only one output terminal 113, as well as only one connection line between the two capacitors 102, 103, instead of two connection lines between two transformers 2, 3.

The capacitors of the capacitive signal transmission arrangement 101 can be produced using the method steps that have been explained before with reference to producing the primary and the secondary windings of the transformers 2, 3 with the difference that the capacitor plates require only one connection terminal, while the primary and the secondary windings 21, 22, 31, 32 require two terminals, and with the difference that the capacitor plates 121, 122, 131, 132 may have a geometry that is different from the geometry of the primary and secondary windings. All the explanations that have been made with reference to realizing the primary and secondary windings of the inductive signal transmission 1 arrangements apply equivalently to realizing the first and second capacitor plates. In particular, the material used for implementing the primary and secondary windings may correspond to the material used for realizing the capacitor plates, the material of the dielectric layer separating the primary and secondary windings of the transformers may correspond to the capacitor dielectric, and the distance between the primary and secondary windings of one transformer may correspond to the distance between the first and the second capacitor plates of one capacitor.

Like the two transformers 2, 3 of the signal transmission arrangements according to FIGS. 2 and 4 the first and second capacitors 102, 103 of the capacitive signal transmission arrangement 101 could also be implemented in a common dielectric layer above a common semiconductor substrate.

Figure 16:
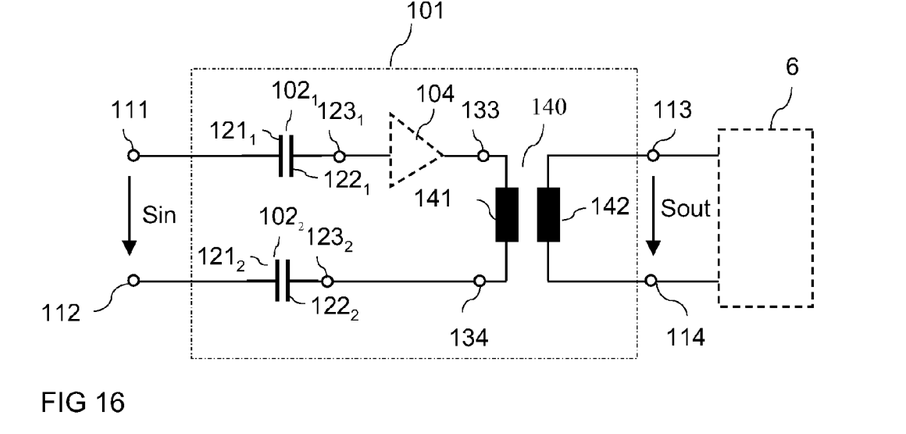
FIG. 16 illustrates a further embodiment of a signal transmission arrangement.

FIG. 16 illustrates an embodiment of a signal transmission arrangement that combines elements of the inductive and capacitive signal transmission arrangements explained before. The arrangement according to FIG. 16 includes two capacitors, namely a first capacitor $102_1$ having a first and a second capacitor plate $121_1$, $122_1$, and a second capacitor $102_2$ having a first and a second capacitor plate $121_2$, $122_2$, and a transformer 140 having a primary and a secondary winding 141, 142. The first capacitor $102_1$ is connected between a first input terminal 111 and a first terminal 133 of the primary winding, and the second capacitor $102_2$ is connected between a second input terminal 112 and a second terminal 134 of the primary winding 141. The primary and the secondary windings 141, 142 are inductively coupled. The secondary winding 142 is connected to output terminals 113, 114 of the transmission arrangement.

Figure 17:
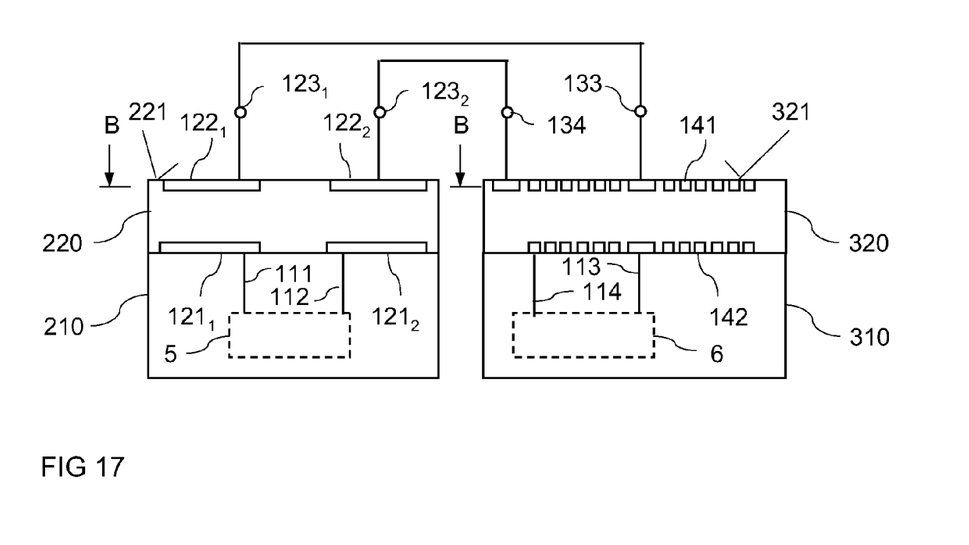
FIG. 17 illustrates a cross section through an arrangement that includes a signal transmission arrangement according to FIG. 16.

Referring to FIG. 17, illustrated is an implementation example of the arrangement according to FIG. 16, the first and second capacitors $102_1$, $102_2$ can be arranged in a first dielectric layer 220 above a first semiconductor substrate 210. The capacitor plates $121_1$, $122_1$ and $121_2$, $122_2$, respectively, that form one of the capacitors are arranged distant to one another in the dielectric layer, and the capacitor plates of the different capacitors are arranged distant to one another in a lateral direction. Optionally, a transmitter circuit 5 is integrated in the first semiconductor substrate 210.

The transformer 140 can be arranged in a second dielectric layer 320 above a second semiconductor substrate 310, where the primary and the secondary windings 141, 142 are arranged distant to one another in the vertical direction.

The capacitors $102_1$, $102_2$ in the first arrangement are connected to the primary winding 141 in the second arrangement via connection lines, such as bonding wires or connection lines in a wiring board.

The explanations made in connection with FIGS. 1 to 9 concerning the implementation of an inductive signal transmission arrangement apply to implementing the transformer 140 accordingly. Equivalently, the explanations made in connection with FIGS. 13 to 15 concerning the implementation of a capacitive signal transmission arrangement apply to implementing the capacitors $102_1$, $102_2$ accordingly.

Further it should be mentioned, that features that have been explained with one example may, of course, be combined with features according to other examples, even if this has not explicitly been mentioned.

What is claimed is:

1. A signal transmission arrangement, comprising:
   input terminals for receiving an input signal;
   output terminals for providing an output signal;
   a first transformer having a primary winding and a secondary winding, the primary winding being coupled to the input terminals; and
   a second transformer having a primary winding and a secondary winding, the primary winding being coupled to the secondary winding of the first transformer, and the secondary winding being coupled to the output terminals, wherein the first transformer and the second transformer are located in a dielectric layer, the dielectric layer isolating the primary winding and the secondary winding of the first and second transformers, wherein the dielectric layer is disposed on a first semiconductor body, and wherein an insulation trench is disposed in the dielectric layer between the first transformer and the second transformer.

2. The signal transmission arrangement of claim 1, wherein the first and second transformers comprise coreless transformers.

3. The signal transmission arrangement of claim 1, further comprising:
an amplifier coupled between the secondary winding of the first transformer and the primary winding of the second transformer.

4. The signal transmission arrangement of claim 1, further comprising:
a transmitter circuit coupled to the input terminals.

5. The signal transmission arrangement of claim 1, further comprising:
a receiver circuit coupled to the output terminals.

6. The signal transmission arrangement of claim 1, wherein the insulation trench comprises a insulating material and wherein the dielectric layer comprises a dielectric material, and wherein the insulating material comprises a material with higher voltage blocking capability than the dielectric material.

7. The signal transmission arrangement of claim 1, wherein the primary winding of the first transformer and the secondary winding of the second transformer are disposed in a first plane, and wherein the secondary winding of the first transformer and the primary winding of the second transformer are disposed in a second plane.

8. The signal transmission arrangement of claim 1, wherein the primary winding of the first transformer and the secondary winding of the second transformer are disposed in a first dielectric layer, and wherein the secondary winding of the first transformer and the primary winding of the second transformer are disposed in a second dielectric layer.

9. The signal transmission arrangement of claim 8, wherein a third dielectric layer is located between the first dielectric layer and the second dielectric layer.

10. The signal transmission arrangement of claim 1, further comprising:
a transmitter circuit coupled to the input terminals and a receiver circuit coupled to the output terminals, the transmitter circuit or the receiver circuit being integrated in the first semiconductor body.

11. The signal transmission arrangement of claim 10, further comprising a second semiconductor body, the other of the transmitter circuit or the receiver circuit being integrated in the second semiconductor body.

12. A signal transmission arrangement, comprising:
an input terminal for receiving an input signal;
an output terminal for providing an output signal;
a first capacitor having a first capacitor plate and a second capacitor plate, the first capacitor plate of the first capacitor being coupled to the input terminal; and
a second capacitor having a first capacitor plate and a second capacitor plate, the first capacitor plate of the second capacitor being coupled to the second capacitor plate of the first capacitor, and the second capacitor plate of the second capacitor being coupled to the output terminal;
a dielectric layer isolating the first and the second capacitor plates of the first and second capacitors, the first and the second capacitor plates of each of the first and second capacitors being arranged distant to one another in a first direction, the first capacitor plates of the first and second capacitors being arranged distant to one another in a second direction, and the second capacitor plates of the first and second capacitors being arranged distant to one another in the second direction; and
an insulation trench is arranged between the first and the second capacitor.

13. The signal transmission arrangement of claim 12, wherein an insulation material of the insulation trench comprises a higher voltage blocking capability than a dielectric material of the dielectric layer.

14. A signal transmission arrangement, comprising:
input terminals for receiving an input signal;
output terminals for providing an output signal;
a first transformer having a primary winding and a secondary winding, the primary winding of the first transformer being coupled to the input terminals;
a second transformer having a primary winding and a secondary winding, the primary winding of the second transformer being coupled to the secondary winding of the first transformer; and
a third transformer having a primary winding and a secondary winding, the primary winding of the third transformer being coupled to the secondary winding of the second transformer and the secondary winding of the third transformer being coupled to the output terminals,
wherein the first transformer, the second transformer and the third transformer are connected in series, and wherein first transformer, the second transformer and the third transformer are arranged in a single dielectric layer; and
a first insulation trench and a second insulation trench, the first insulation trench arranged between the first transformer and the second transformer and the second insulation trench arranged between the second transformer and the third transformer, wherein a first insulation material of the first insulation trench comprises a higher voltage blocking capability than a dielectric material of the dielectric layer, and wherein a second insulation material of the second insulation trench comprises a higher voltage blocking capability than the dielectric material of the dielectric layer.

15. A signal transmission arrangement, comprising:
an input terminal for receiving an input signal;
an output terminal for providing an output signal;
a first capacitor having a first capacitor plate and a second capacitor plate, the first capacitor plate of the first capacitor being coupled to the input terminal; and
a second capacitor having a first capacitor plate and a second capacitor plate, the first capacitor plate of the second capacitor being coupled to the second capacitor plate of the first capacitor, and the second capacitor plate of the second capacitor being coupled to the output terminal,
wherein the first capacitor and the second capacitor are located in a dielectric layer, the dielectric layer isolating the first capacitor plate and the second capacitor plate of the first and second capacitors, wherein the dielectric layer is disposed on a semiconductor body, and wherein an insulation trench is disposed in the dielectric layer between the first capacitor and the second capacitor.

16. The signal transmission arrangement of claim 15, further comprising:
an amplifier coupled between the second capacitor plate of the first capacitor and the first capacitor plate of the second capacitor.

17. The signal transmission arrangement of claim 15, further comprising:
a transmitter circuit coupled to the input terminal.

18. The signal transmission arrangement of claim 15, further comprising:
a receiver circuit coupled to the output terminals.

19. The signal transmission arrangement of claim 15, further comprising:
a dielectric layer isolating the first and the second capacitor plates of the first and second capacitors, the first and the second capacitor plates of each of the first and second capacitors being arranged distant to one another in a first direction, the first capacitor plates of the first and second capacitors being arranged distant to one another in a second direction, and the second capacitor plates of the first and second capacitors being arranged distant to one another in the second direction.

20. The signal transmission arrangement of claim 19, wherein a distance both between the first capacitor plates and between the second capacitor plates is at least a distance between the first capacitor plate and the second capacitor plate of one of the first and second capacitors.

21. The signal transmission arrangement of claim 19, further comprising:
a semiconductor body carrying the dielectric layer.

22. The signal transmission arrangement of claim 21, further comprising:
a transmitter circuit coupled to the input terminal and a receiver circuit coupled to the output terminal, the transmitter circuit or the receiver circuit being integrated in the semiconductor body.

23. The signal transmission arrangement of claim 15, further comprising an insulation trench, the insulation trench being arranged between the first and second capacitor, wherein an insulation material of the insulation trench comprises a higher voltage blocking capability than a dielectric material of the dielectric layer.

24. A signal transmission arrangement, comprising:
an input terminal for receiving an input signal;
an output terminals for providing an output signal;
a capacitor having a first capacitor plate and a second capacitor plate, the first capacitor plate of the capacitor being coupled to the input terminal; and
a transformer having a primary winding and a secondary winding, the primary winding being coupled to the second capacitor plate of the capacitor, and the secondary winding being coupled to the output terminals,
wherein the capacitor and the transformer are located in a dielectric layer, the dielectric layer isolating the first capacitor plate and the second capacitor plate of capacitor, and the primary winding and the secondary winding of the transformer, wherein the dielectric layer is disposed on a semiconductor body, and wherein an insulation trench is disposed in the dielectric layer between the capacitor and the transformer.

25. The signal transmission arrangement of claim 24, wherein the transformer comprises a coreless transformer.

26. The signal transmission arrangement of claim 24, further comprising an amplifier coupled between the second capacitor plate of the capacitor and the primary winding of the transformer.

27. The signal transmission arrangement of claim 24, wherein an insulation material of the insulation trench comprises a higher voltage blocking capability than a dielectric material of the dielectric layer.

* * * * *